United States Patent
Wang

(10) Patent No.: US 7,183,143 B2
(45) Date of Patent: Feb. 27, 2007

(54) METHOD FOR FORMING NITRIDED TUNNEL OXIDE LAYER

(75) Inventor: Tzu-Yu Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 94 days.

(21) Appl. No.: 10/605,782

(22) Filed: Oct. 27, 2003

(65) Prior Publication Data

US 2005/0090062 A1    Apr. 28, 2005

(51) Int. Cl.
H01L 21/84 (2006.01)
H01L 21/00 (2006.01)
H01L 21/336 (2006.01)
H01L 21/8234 (2006.01)
H01L 21/8238 (2006.01)
H01L 21/8242 (2006.01)
H01L 21/20 (2006.01)
H01L 21/469 (2006.01)

(52) U.S. Cl. .................. 438/149; 438/151; 438/155; 438/157; 438/165; 438/197; 438/201; 438/212; 438/216; 438/244; 438/253; 438/257; 438/258; 438/260; 438/261; 438/263; 438/264; 438/266; 438/287; 438/387; 438/396; 438/763; 438/769; 438/770; 438/771; 438/772; 438/773; 438/774; 438/775; 438/776; 438/777; 438/787; 438/788; 438/791; 438/792; 438/954; 257/E21.497; 257/E21.284; 257/E21.302; 257/E21.353

(58) Field of Classification Search ............... 438/149, 438/151, 155, 157, 165, 197, 201, 212, 216, 438/244, 253, 257–258, 260, 261, 263–264, 438/266, 287, 387, 396, 763, 769–777, 787–788, 438/791–792, 954

See application file for complete search history.

(56) References Cited

U.S. PATENT DOCUMENTS

| 5,885,870 | A  | * | 3/1999 | Maiti et al. .................. 438/261 |
| 5,918,125 | A  | * | 6/1999 | Guo et al. ................... 438/264 |
| 6,252,276 | B1 | * | 6/2001 | Ramsbey et al. ........... 257/321 |
| 6,380,033 | B1 |   | 4/2002 | He et al. |
| 6,413,881 | B1 |   | 7/2002 | Aronowitz et al. |
| 6,461,984 | B1 | * | 10/2002 | Han et al. ................... 438/788 |
| 6,545,312 | B2 | * | 4/2003 | Kusumi et al. ............. 257/315 |
| 6,548,366 | B2 |   | 4/2003 | Niimi et al. |
| 6,551,948 | B2 | * | 4/2003 | Ohmi et al. ................ 438/778 |
| 6,559,007 | B1 |   | 5/2003 | Weimer |
| 6,605,511 | B2 | * | 8/2003 | Pham et al. ................. 438/275 |
| 6,794,764 | B1 | * | 9/2004 | Kamal et al. ............... 257/900 |
| 6,803,272 | B1 | * | 10/2004 | Halliyal et al. ............. 438/240 |
| 2003/0073288 | A1 | * | 4/2003 | Pham et al. ................. 438/261 |
| 2003/0181007 | A1 | * | 9/2003 | Huang et al. ............... 438/257 |
| 2005/0062098 | A1 | * | 3/2005 | Mahajani et al. ........... 257/324 |
| 2005/0224860 | A1 | * | 10/2005 | Hendriks et al. ........... 257/315 |

* cited by examiner

Primary Examiner—Michael Lebentritt
Assistant Examiner—Mohsen Ahmadi
(74) Attorney, Agent, or Firm—Jianq Chyun IP Office

(57) ABSTRACT

A method for forming a nitrided tunnel oxide layer is described. A silicon oxide layer as a tunnel oxide layer is formed on a semiconductor substrate, and a plasma nitridation process is performed to implant nitrogen atoms into the silicon oxide layer. A thermal drive-in process is then performed to diffuse the implanted nitrogen atoms across the silicon oxide layer.

7 Claims, 3 Drawing Sheets

METHOD FOR FORMING NITRIDED TUNNEL OXIDE LAYER

BACKGROUND OF INVENTION

1. Field of the Invention

The present invention relates to a semiconductor process. More particularly, the present invention relates to a method for forming a nitrided tunnel oxide layer of non-volatile memory.

2. Description of the Related Art

As a result of the continuous reduction of the price per unit memory size, electrically erasable programmable read-only memory (EEPROM) devices are more often used as non-volatile storage devices. One essential part of an EEPROM cell is the tunnel oxide layer, which should be sufficiently thin so that carriers can tunnel through under a high electric field. The quality and stability of the tunnel oxide layer are also important issues, since the charge retention capability and other important characteristics of an EEPROM device is closely related to these properties.

There have been many methods provided for improving the quality and stability of a tunnel oxide, wherein most of these methods utilize nitrogen doping in silicon oxide. For example, U.S. Pat. No. 5,885,870 patent and U.S. Pat. No. 6,380,033 patent disclose a method for forming a nitrided tunnel oxide layer, wherein NO or $N_2O$-annealing is performed to nitridate a tunnel oxide layer. With the NO or $N_2O$-annealing treatment, the leakage current induced by negative Fowler-Nordheim stress (negative FN-SILC) and the threshold voltage ($V_t$) shift of an EEPROM device can be reduced. However, the method cannot effectively reduce the leakage current induced by a positive FN stress (positive FN-SILC), and the distribution window of the incorporated nitrogen atoms is small in accordance to this method. Moreover, nitrogen atoms tend to pile up at the bottom interface of the tunnel oxide layer according to this method, so that the carrier mobility and the integrity of the periphery gate oxide of the EEPROM device are degraded.

In addition, the U.S. Pat. No. 6,559,007 patent discloses another method for forming a nitrided tunnel oxide layer, wherein $NH_3$-anealing is performed to nitridate a tunnel oxide layer for inhibiting diffusion of hydroxyl and hydrogen species in the tunnel oxide layer. However, the integrated process in this method is quite complicated, and the distribution window of the incorporated nitrogen atoms is small as in the case of NO or $N_2O$-annealing. Similarly, nitrogen atoms also tend to pile up at the bottom interface of the tunnel oxide layer according to this method. Meanwhile that the carrier mobility and the integrity of the periphery gate oxide of the EEPROM device are degraded.

On the other hand, the U.S. Pat. No. 6,551,948 patent discloses a method for forming an oxynitride film in inter-poly dielectric applications, wherein a polysilicon film is exposed to plasma formed by exciting a mixed gas containing oxygen and nitrogen. In addition, the U.S. Pat. No. 6,413,881 and U.S. Pat. No. 6,548,366 patents disclose methods for forming an ultra-thin gate oxide layer, wherein nitrogen plasma is used to nitridate an ultra-thin gate oxide layer for inhibiting impurity diffusion.

SUMMARY OF INVENTION

Accordingly, this invention provides a method for forming a nitrided tunnel oxide layer. The method is capable of reducing positive or negative FN-SILC and $V_t$ shift without the problems of lower carrier mobility and degraded periphery gate oxide integrity caused by the NO or $N_2O$-annealing method as in the prior art.

The method for forming a nitrided tunnel oxide layer of this invention includes the following steps. A silicon oxide layer as a tunnel oxide layer is formed on a semiconductor substrate, and a plasma nitridation process is performed to implant nitrogen atoms into the silicon oxide layer. Then, a thermal drive-in process is performed to diffuse the implanted nitrogen atoms across the silicon oxide layer.

By using the method of this invention to form a nitrided tunnel oxide layer, the low-field SILC and $V_t$ shift of the memory device can be reduced. Moreover, with the nitridation method of this invention, the incorporated nitrogen atoms will not pile up at the bottom interface of the silicon oxide layer. Therefore, degradation of the carrier mobility or the integrity of the periphery gate oxide of the memory device can be prevented.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
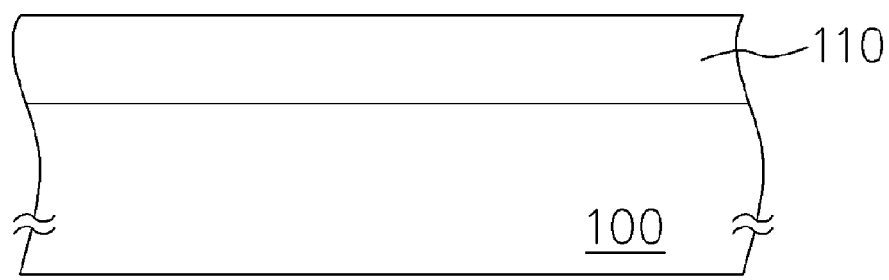
FIGS. 1A–1C illustrate a process flow of forming a nitrided tunnel oxide layer according to a preferred embodiment of this invention.
Figure 1B:
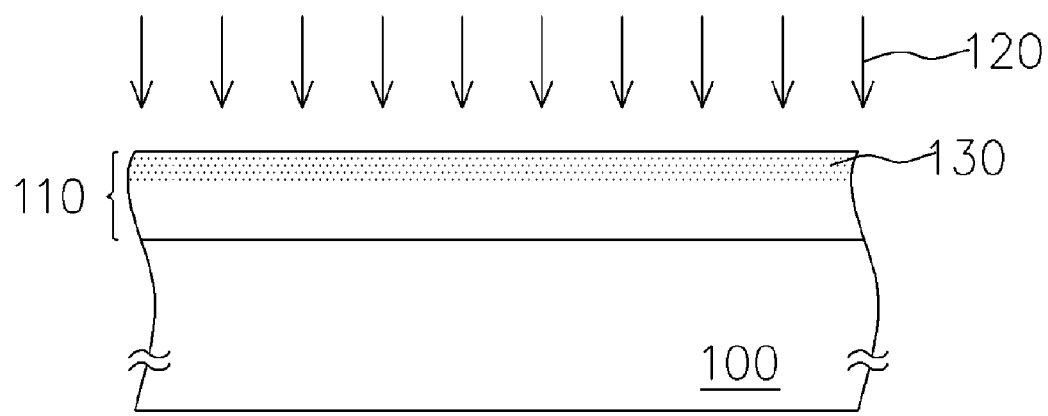
Figure 1C:
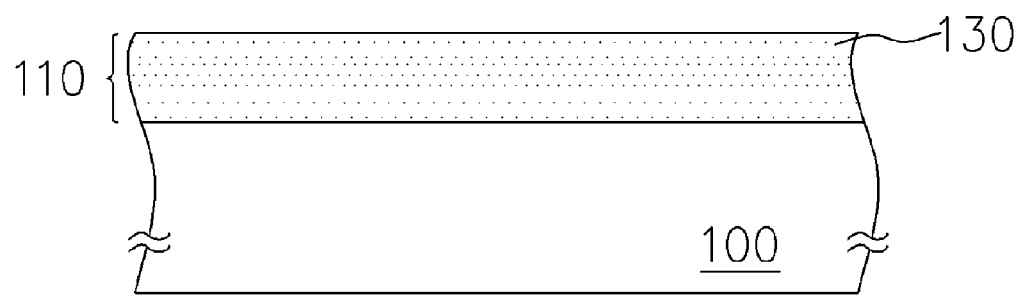

FIGS. 1A–1C illustrate a process flow of forming a nitrided tunnel oxide layer according to the preferred embodiment of this invention.

Referring to FIG. 1A, a silicon substrate 100, such as a P-doped single-crystal silicon substrate, is provided. A silicon oxide layer 110 as a tunnel oxide layer is then formed on the silicon substrate 100 with, for example, an in-situ steam generation (ISSG) process.

Referring to FIG. 1B, a plasma nitridation process is performed by exposing the silicon oxide layer 110 to nitrogen-containing plasma 120, whereby nitrogen atoms are implanted into the surface layer of the silicon oxide layer 110. The nitrogen-containing plasma 120 may be $N_2$ plasma, and the plasma nitridation process can be performed under a temperature lower than 400° C.

Referring to FIG. 1C, a thermal drive-in process is performed to diffuse the incorporated nitrogen atoms 130 across the silicon oxide layer 110. The thermal drive-in process can be a furnace annealing process or a rapid thermal annealing (RTA) process, and is preferably conducted under 850 to 1100° C. for 30 seconds to 1 hour.

EXAMPLES

In the examples, a pure ISSG oxide layer of 85 Å, an ISSG oxide layer of 85 Ånitrided with NO or $N_2O$-annealing and an ISSG oxide layer of 85 Å that has been subjected to the plasma nitridation step and the thermal drive-in step of this invention are provided respectively. Different memory samples are then fabricated based on the respective tunnel oxide layers. The quality and characteristics of each kind of tunnel oxide layer are evaluated via several tests on the above memory samples, and the results are shown in FIGS. 2–5, wherein the memory sample of this invention is labeled with "ISSG 85 Å oxide+Plasma nitridation+Thermal drive-in".

Figure 2:
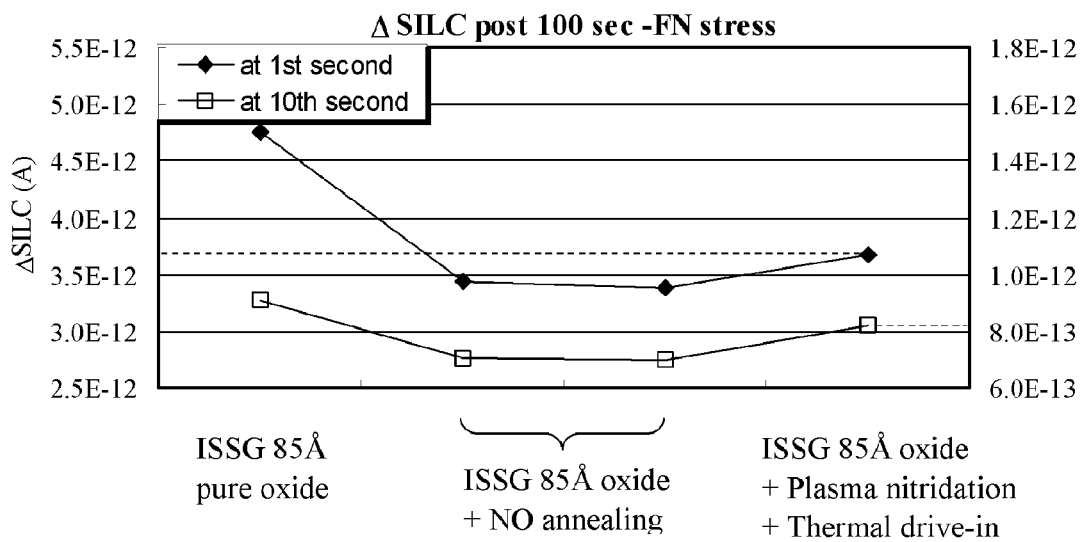
FIG. 2 shows the results of a negative FN-SILC test on different memory samples, wherein the memory sample of this invention is labeled with "ISSG 85 Åoxide+Plasma nitridation+Thermal drive-in".

Referring to FIG. 2, FIG. 2 shows the results of a negative FN-SILC test on the above memory samples. In the test, a negative FN stress about −11.5 MV/cm is applied across the tunnel oxide layer of each sample for 100 seconds, and then the differential SILC (ΔSILC) of each sample is measured under a low field of 6 MV/cm. As shown in FIG. 2, the capability for reducing negative FN-SILC of the method of this invention is approximately the same as that of the NO or $N_2O$-annealing method in the prior art.

Figure 3:
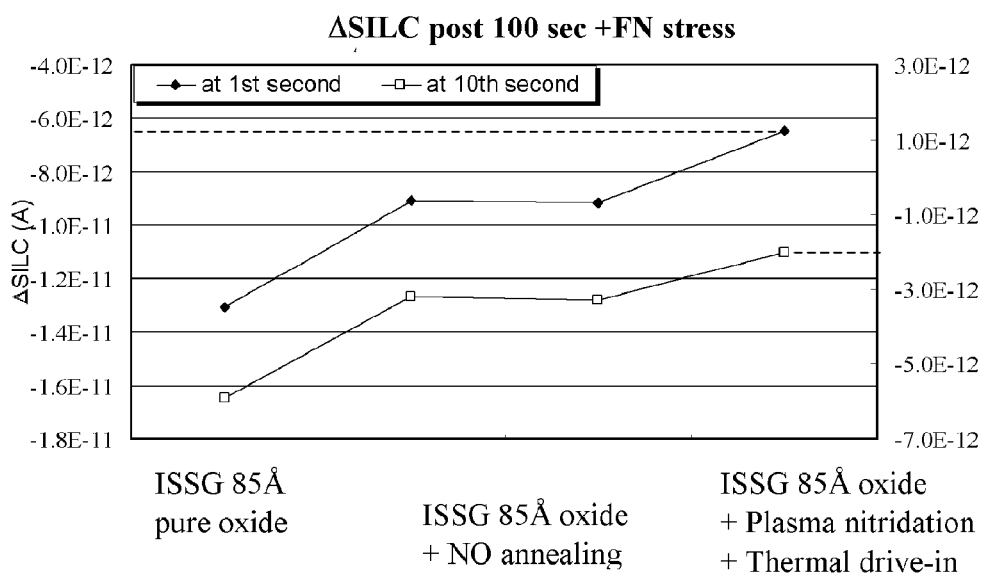
FIG. 3 shows the results of a positive FN-SILC test on the above memory samples.

FIG. 3 shows the results of a positive FN-SILC test on the above memory samples. In the test, a positive FN stress about 16 MV/cm is applied across the tunnel oxide layer of each sample for 100 seconds, and then the differential SILC (ΔSILC) of each sample is measured under a low field of −6 MV/cm. As shown in FIG. 3, in accordance to the present invention, the capability for lowering the positive FN-SILC is even better than that of the NO or $N_2O$-annealing method in the prior art.

Figure 4:
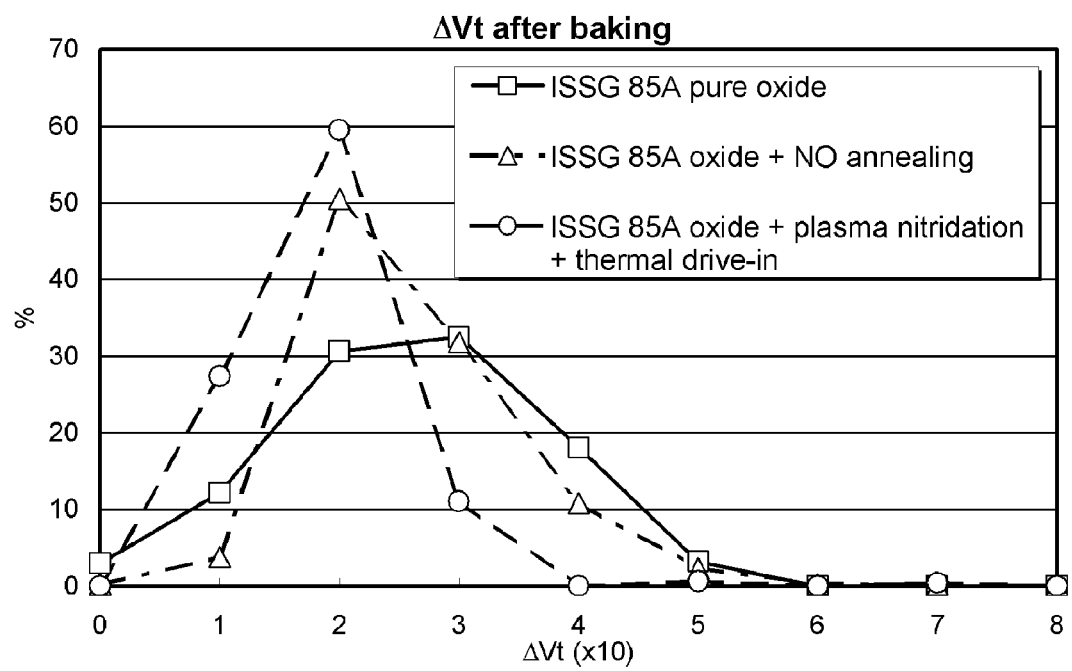
FIG. 4 shows the results of a $V_t$-shift test on the above memory samples.

FIG. 4 shows the results of a $V_t$-shift test on the above memory samples. In the test, each sample is subjected to a baking treatment under 250° C. for 24 hours, and then the $V_t$-shift ($\Delta V_t$) distribution of each sample is measured. As shown in claim 4, at the high-$\Delta V_t$ region, the $\Delta V_t$ distribution probability of the memory sample of this invention is lower than those of the memory samples of the prior art.

Figure 5:
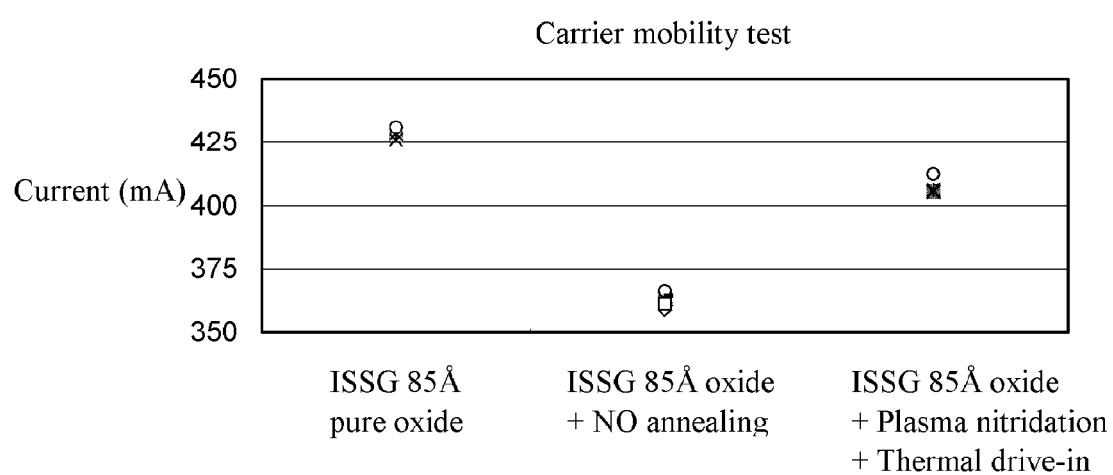
FIG. 5 shows the results of a carrier mobility test on the above memory samples.

FIG. 5 shows the results of a carrier mobility test on the above memory samples, wherein the carrier mobility is indicated by the magnitude of the channel current (mA). As shown in FIG. 5, the carrier mobility degradation resulted from the nitridation method is much less in this invention than that resulted from the NO or $N_2O$-annealing method in the prior art.

As mentioned above, by using the method of this invention to nitridate the tunnel oxide layer, the low-field SILC and $V_t$ shift of the memory device can be reduced. Moreover, with the nitridation method of this invention, the incorporated nitrogen atoms will not pile up at the bottom interface of the silicon oxide layer. Therefore, degradations of the carrier mobility and the integrity of the periphery gate oxide of the memory device can be prevented.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A method for forming a nitrided tunnel oxide layer, comprising:
    performing an in-situ steam generation (ISSG) process to form a silicon oxide layer as a tunnel oxide layer on a semiconductor substrate;
    performing a plasma nitridation process to introduce nitrogen atoms into the silicon oxide layer; and
    performing a thermal drive-in process to diffuse the introduced nitrogen atoms across the silicon oxide layer, wherein the thermal drive-in process is conducted under 850 to 1100° C. for 30 seconds to 1 hour.

2. The method of claim 1, wherein the plasma nitridation process utilizes $N_2$ plasma.

3. The method of claim 1, wherein the plasma nitridation process is conducted under a temperature lower than 400° C.

4. The method of claim 1, wherein the thermal drive-in process comprises a furnace annealing process or a rapid thermal annealing process.

5. A method for forming a nitrided tunnel oxide layer, comprising:
    performing an in-situ steam generation (ISSG) process to form a silicon oxide layer as a tunnel oxide layer on a semiconductor substrate;
    performing a $N_2$ plasma nitridation process to introduce nitrogen atoms into the silicon oxide layer; and
    performing a thermal drive-in process to diffuse the introduced nitrogen atoms across the silicon oxide layer, wherein the thermal drive-in process is conducted under 850 to 1100° C. for 30 seconds to 1 hour.

6. The method of claim 5, wherein the $N_2$ plasma nitridation process is conducted under a temperature lower than 400° C.

7. The method of claim 5, wherein the thermal drive-in process comprises a furnace annealing process or a rapid thermal annealing process.

* * * * *